United States Patent
Mellein

(10) Patent No.: US 10,110,329 B2
(45) Date of Patent: Oct. 23, 2018

(54) SYSTEM AND METHOD FOR TESTING WITH RESPECT TO A FAR-FIELD REGION

(71) Applicant: Rohde & Schwarz GmbH & Co. KG, Munich (DE)

(72) Inventor: Heinz Mellein, Haar (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/609,904

(22) Filed: May 31, 2017

(65) Prior Publication Data

US 2018/0227060 A1    Aug. 9, 2018

Related U.S. Application Data

(60) Provisional application No. 62/454,171, filed on Feb. 3, 2017.

(51) Int. Cl.
  *H04B 7/00*      (2006.01)
  *H04B 17/30*     (2015.01)
  *G01R 29/10*     (2006.01)

(52) U.S. Cl.
  CPC .............. *H04B 17/30* (2015.01); *G01R 29/10* (2013.01)

(58) Field of Classification Search
  CPC .. H04B 17/00; H04B 17/0012; H04B 17/002; H04B 17/003; H04W 24/00
  See application file for complete search history.

(56) References Cited

U.S. PATENT DOCUMENTS

| 9,742,505 B2* | 8/2017 | Su ........................ H04B 17/0085 |
| 2014/0187260 A1* | 7/2014 | Jiang ..................... H04W 64/00 |
| | | 455/456.1 |
| 2016/0033254 A1* | 2/2016 | Zeine ..................... H02J 5/005 |
| | | 307/104 |

OTHER PUBLICATIONS

3GPP TR 38.803 V1.1.0 (Jan. 2017), "3rd Generation Partnership Project;Technical Specification Group Radio Access Network; Study on New Radio Access Technology; RF and co-existence aspects (Release 14)", Valbonne, France, 2016, 68 pages.

Rohde & Schwarz,"IEEE Standard for Definitions for Terms for Antennas", IEEE Antennas and Propagation Society, article in IEEE Standard 145™-2013, Aug. 20, 2012, New York, USA, retrieved on May 31, 2017, from "http://ieeexplore.ieee.org/document/6758443/versions", 92 pages.

Rohde & Schwarz, "IEEE Recommended Practice for Near-Field Antenna Measurements", IEEE Standard for Definitions for Terms for Antennas, article in IEEE Standards Association 1720™-2012, Dec. 5, 2012, New York, USA, retrieved on May 31, 2017, from "https://standards.ieee.org/findstds/standard/1720-2012.html", 102 pages.

(Continued)

*Primary Examiner* — Tuan Pham
(74) *Attorney, Agent, or Firm* — Ditthavong & Steiner, P.C.

(57) ABSTRACT

A system for testing a device under test with respect to a far-field region of the device under test is provided. The system comprises a test unit, and an antenna connected to the test unit. The test unit is configured to determine several samples of measured power values at different distances between the antenna and the device under test. In addition to this, the test unit is configured to calculate a minimum far-field distance on the basis of the several samples of measured power values.

16 Claims, 3 Drawing Sheets

(56) References Cited

OTHER PUBLICATIONS

Rohde & Schwarz, R4-1610010 "Link budget considerations for radiated modulation quality measurements", article in 3GPP TSG-RAN WG4 Meeting #81, Nov. 14-18, 2016, Reno, USA, 3 pages.
Schantz, "Near Field Channel Model" article in IEEE P802. 15-04/0417r2, Wireless Personal Area Networks, Oct. 27, 2004, retrieved on May 31, 2017, from "http://grouper.ieee.org/groups/802/15/pub/04/15-04-0417-02-004a-near-field-channel-model.pdf", 13 pages.

\* cited by examiner

SYSTEM AND METHOD FOR TESTING WITH RESPECT TO A FAR-FIELD REGION

RELATED APPLICATION

The present application claims priority to U.S. Provisional Application No. 62/454,171, filed on Feb. 3, 2017, which is incorporated herein by reference in its entirety.

TECHNICAL FIELD

The invention relates to a system and a method for testing a device under test with respect to a far-field region, more specifically, the system and method allow for calculating a minimum far-field distance.

BACKGROUND ART

Generally, in times of an increasing number of applications employing wireless technologies, there is a growing need of a system and a method for testing such applications with special respect to a far-field region in a most efficient manner in order to allow for a highly performant and low-cost test equipment for testing the correct functionality of said applications.

IEEE Std 1720-2012 relates to recommended practice for near-field antenna measurements. Disadvantageously, the subject-matter of said document does not allow for calculating a minimum far-field distance, which makes the process of testing inefficient and expensive due to the increased space requirement because the minimum far-field distance cannot doubtless be chosen.

Accordingly, there is a need to provide a system and a method for testing a device under test with respect to a far-field region, wherein especially a minimum far-field distance is calculated.

SUMMARY OF THE INVENTION

According to a first aspect of the invention, a system for testing a device under test with respect to a far-field region of the device under test is provided. The system comprises a test unit, and an antenna connected to the test unit. The test unit is configured to determine several samples of measured power values at different distances between the antenna and the device under test. In addition to this, the test unit is configured to calculate a minimum far-field distance on the basis of the several samples of measured power values. Advantageously, the process of testing is very cost-efficient due to a space requirement reduced to a minimum.

According to a first preferred implementation form of the first aspect, the region in which the decay of the intensity of the radiation radiated by the device under test measured at the antenna with increasing distance is stronger as proportional to the square of the distance is decided to be the near-field, and the region in which the decay of the intensity of the radiation radiated by the device under test measured at the antenna with increasing distance is proportional to the square or less to the square of the distance is decided to be the far-field. Advantageously, the minimum far-field distance can especially be determined in a most efficient manner.

According to a further preferred implementation form of the first aspect, the distance between the antenna and the device under test is adjustable. Additionally or alternatively, the distance between the antenna and the device under test is automatically adjusted according to the calculated minimum far-field distance. Advantageously, the distance between the device under test and the antenna can be varied easily. Additionally or alternatively, the device under test or the antenna is movable.

According to a further preferred implementation form of the first aspect, calculating the minimum far-field distance is based on Friis transmission equation.

According to a further preferred implementation form of the first aspect, the difference between the different distances is constant making the distances equidistant.

According to a further preferred implementation form of the first aspect, the device under test is configured to measure signal power and to report the corresponding measured power values to the test unit. Advantageously, there is no need of additional hardware for measuring signal power at the side of the device under test.

According to a further preferred implementation form of the first aspect, the report of the corresponding measured power values is transmitted to the test unit wirelessly.

According to a further preferred implementation form of the first aspect, the report of the corresponding measured power values is transmitted to the test unit via a separate interface established for the purpose of transmitting the report.

According to a further preferred implementation form of the first aspect, the report of the corresponding measured power values is transmitted to the test unit via an existing interface between the system and the device under test.

According to a second aspect of the invention, a method for testing a device under test with respect to a far-field region of the device under test is provided. The method comprises the steps of determining several samples of measured power values at different distances between an antenna and the device under test with the aid of a test unit connected to the antenna, and calculating a minimum far-field distance on the basis of the several samples of measured power values. Advantageously, the process of testing is very cost-efficient due to a space requirement reduced to a minimum.

According to a first preferred implementation form of the second aspect, the method further comprises the step of deciding the region in which the decay of the intensity of the radiation radiated by the device under test measured at the antenna with increasing distance is stronger as proportional to the square of the distance to be the near-field, and deciding the region in which the decay of the intensity of the radiation radiated by the device under test measured at the antenna with increasing distance is proportional to the square or less to the square of the distance to be the far-field. Advantageously, the minimum far-field distance can especially be determined in a most efficient manner.

According to a further preferred implementation form of the second aspect, the method further comprises the step of adjusting the distance between the antenna and the device under test. Additionally or alternatively, the method further comprises the step of automatically adjusting the distance between the antenna and the device under test according to the calculated minimum far-field distance. Advantageously, the distance between the device under test and the antenna can be varied easily. Additionally or alternatively, the method comprises the step of moving the device under test or the antenna.

According to a further preferred implementation form of the second aspect, the step of calculating the minimum far-field distance is based on Friis transmission equation.

According to a further preferred implementation form of the second aspect, the difference between the different distances is constant making the distances equidistant.

According to a further preferred implementation form of the second aspect, the method further comprises the step of measuring signal power and reporting the measured power values to the test unit with the aid of the device under test. Advantageously, there is no need of additional hardware for measuring signal power at the side of the device under test.

According to a further preferred implementation form of the second aspect, the report of the corresponding measured power values is transmitted to the test unit wirelessly.

According to a further preferred implementation form of the second aspect, the report of the corresponding measured power values is transmitted to the test unit via a separate interface to be established for the purpose of transmitting the report.

According to a further preferred implementation form of the second aspect, the report of the corresponding measured power values is transmitted to the test unit via an existing interface between the system and the device under test.

BRIEF DESCRIPTION OF THE DRAWING

Exemplary embodiments of the invention are now further explained with respect to the drawings by way of example only, and not for limitation. In the drawings.

DETAILED DESCRIPTION OF THE PREFERRED EMBODIMENTS

Figure 1:
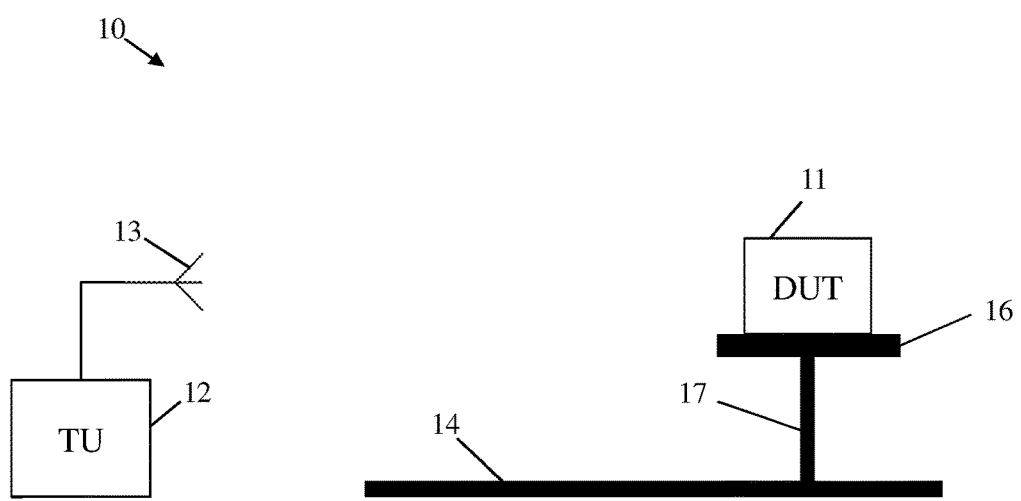
FIG. 1 shows an exemplary embodiment of the first aspect of the invention.

In advance, before exemplary embodiments of the invention are explained with respect to the drawings by way of example, some general facts and definitions with respect to the invention are mentioned in the following.

On the one hand, the inventive over-the-air testing system shall provide measurement capabilities in the far-field region for high frequencies especially above 6 GHz. Thus, the system for testing a device under test is not only provided with respect to a far-field region of the device under test but also preferably for operating frequencies above 6 GHz of the device under test.

On the other hand, the power link budget of the over-the-air measurement setup is a limiting factor for the measurement distance, i.e. the measurement distance should be minimized especially without leaving the far-field region.

As a consequence of this, the invention especially allows for evaluating the lower bound of the far-field region, i.e. the minimum far-field distance, in order to minimize the test setup size.

In this context, it should be also mentioned that the minimum far-field distance $r_f$ can be calculated for standard antenna elements and well know antenna array geometries. A definition of the far-field region $r > r_f$ based on the diameter D of the smallest sphere that encloses the radiating parts of the device under test can be provided as follows:

$$r > r_f = \max\left\{\frac{2D^2}{\lambda}, 10D, 10\lambda\right\}, \quad (1)$$

wherein $\lambda$ is the wavelength of the signal emitted or received by the device under test.

However, the required diameter might not be exactly known for real implementations of the device under test, which might prevent an estimation of the far-field distance according to equation (1). In particular, it is hard to select D.

As a consequence of this, the safest estimate would be to take D at the largest dimension of the device under test, i.e. diameter of the minimum sphere enclosing the device under test. Nevertheless, this is in contradiction to the general need to reduce size and cost of test system.

It should be pointed out that this situation emphasizes the need to evaluate the minimum far-field distance by means of measurements according to the invention.

Within the scope of the invention, the minimum far-field distance is preferably calculated on the basis of the Friis transmission equation.

According to said Friis transmission equation, the ratio between received power $P_{RX}$ and the transmit power $P_{TX}$ in free space and far-field region is proportional to the inverse square of the distance d and the wave number $$k = \frac{2\pi}{\lambda}$$

as follows:

$$\frac{P_{RX}}{P_{TX}} \sim \frac{1}{(kd)^2} \quad (2)$$

As it can be seen, in logarithmic scale, the received power decreases by 20 dB per decade of distance in free space at a given frequency and constant transmit power. For the sake of completeness, it is mentioned that the received power is preferably measured with the aid of an antenna connected to a test unit, whereas the transmit power of the device under test is preferably known or predefined.

Furthermore, it is to be pointed out that the transmission equation (2) does not apply in the near-field region. Near-field power especially rolls off at powers higher than the inverse square, preferably inverse fourth ($1/d^4$) or even higher. In addition to this, and in contradiction to the far-field region, the electric and magnetic field behave differently in the near-field. Consequently, with respect to the near-field, there are different receive and transmit power relations for the electric and magnetic field to be considered.

Now, with respect to FIG. 1, an exemplary embodiment of a system 10 according to the first aspect of the invention is shown.

The system 10 for testing a device under test 11 with respect to a far-field region of the device under test 11 comprises a test unit 12, and an antenna 13 connected to the test unit 12.

The device under test 11 is movable or rotatable, which may exemplarily be achieved with the aid of a device under test mount comprising a plane 16 being rotatable around an axis 17. Additionally or alternatively, the axis 17 may allow for height adjustment or tilting or a combination thereof.

In addition to this, with special respect to varying the distance between the device under test 11 and the antenna 13, the device under test mount is arranged on a rail 14 in the sense of a gliding carriage. Additionally or alternatively, the antenna 13 is movable.

Furthermore, the test unit 12 is configured to determine several samples of measured power values at different distances between the antenna 13 and the device under test 11, and to calculate a minimum far-field distance on the basis of the several samples of measured power values.

In this context, especially the region in which the decay of the intensity of the radiation radiated by the device under test 11 measured at the antenna 13 with increasing distance is stronger as proportional to the square of the distance is decided to be the near-field, and the region in which the decay of the intensity of the radiation radiated by the device under test 11 measured at the antenna 13 with increasing distance is proportional to the square or even less to the square of the distance is decided to be the far-field.

Additionally or alternatively, calculating the minimum far-field distance is especially based on Friis transmission equation which is:

$$\frac{P_{RX}}{P_{TX}} = G_{TX} G_{RX} \left(\frac{\lambda}{4\pi d}\right)^2, \quad (3)$$

wherein $P_{RX}$ is the input power of the receiving antenna,
$P_{TX}$ is the output power of the transmitting antenna,
$G_{TX}$ is the antenna gain of the transmitting antenna,
$G_{RX}$ is the antenna gain of the receiving antenna,
$\lambda$ is the wavelength, and
d is the distance between the two antennas.

In addition to this, the difference between the different distances may preferably be constant making the differences equidistant.

Moreover, the device under test 11 may especially be configured to measure signal power and to report the corresponding measured power values to the test unit 12.

Additionally or alternatively, said report of the corresponding measured power values may preferably be transmitted to the test unit 12 in a wireless manner.

In addition to this or as an alternative, said report of the corresponding measured power values may especially be transmitted to the test unit 12 via a separate interface established for the purpose of transmitting the report. This interface may be a wired or a wireless one.

Further additionally or alternatively, the report of the corresponding measured power values may preferably be transmitted to the test unit 12 via an existing interface between the system 10 and the device under test 11. This interface may especially be the wireless interface which connects the device under test 11 and the test unit 12.

Figure 2:
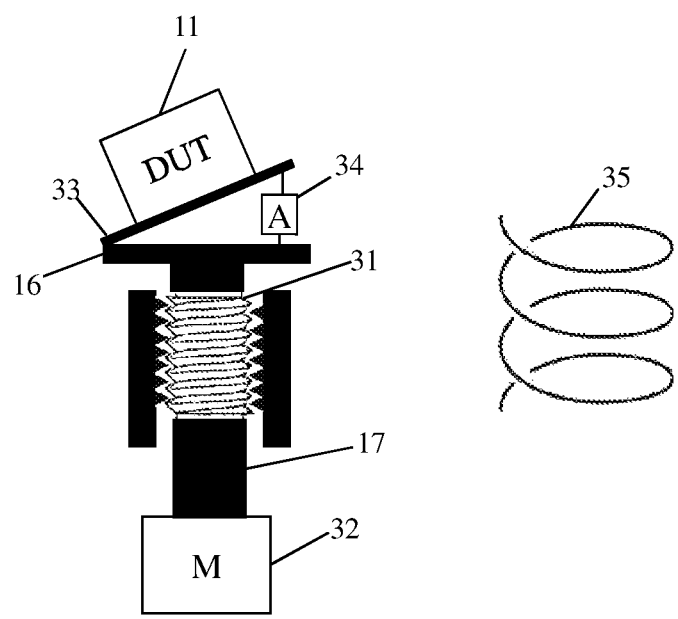
FIG. 2 shows a detailed exemplary embodiment of a device under test mount.

In FIG. 2, an embodiment of the device under test mount is shown in greater detail. In this context, the device under test mount comprises a first plane 16 attached to a first end of an axis 17, wherein the axis 17 comprises a thread 31 for moving the plane 16 up and down with the aid of a motor 32 attached to a second end of the axis 17. As it can be seen, rotating the axis 17 with the aid of the motor 32 serves the height adjustment of the first plane 16, and thus also of the device under test 11.

Furthermore, the device under test 11 is attached to a second plane 33 which is attached to the first plane 16 in a tiltable manner. For the purpose of tilting the device under test 11, and thus for tilting the second plane 33 with respect to the first plane 16, the device under test mount comprises an actuator 34 which tilts the second plane 33 with respect to the first plane 16.

In addition to this, FIG. 2 illustrates an exemplary trace 35 of movement of the device under test 11 in the case that the device under test 11 is moved down in a tilted condition, which leads to the helical trace 35.

Figure 3:
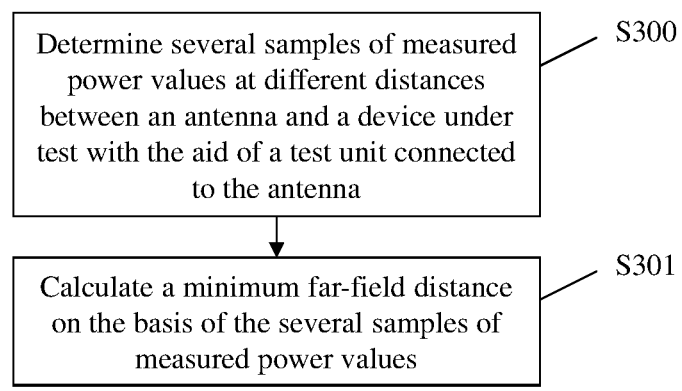
FIG. 3 shows a flow chart of an exemplary embodiment of the second aspect of the invention.

Finally, FIG. 3 shows a flow chart of an exemplary embodiment of the inventive method. In a first step S300, several samples of measured power values at different distances between an antenna and a device under test are determined with the aid of a test unit connected to the antenna. Then, in a second step S301, a minimum far-field distance is calculated on the basis of the several samples of measured power values.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A system for testing a device under test with respect to a far-field region of the device under test, the system comprising:
    a test unit, and
    an antenna connected to the test unit,
    wherein the test unit is configured to determine several samples of measured power values at different distances between the antenna and the device under test,
    wherein the test unit is configured to calculate a minimum far-field distance on the basis of the several samples of measured power values, and
    wherein the region in which the decay of the intensity of the radiation radiated by the device under test measured at the antenna with increasing distance is stronger as proportional to the square of the distance is decided to be the near-field, and the region in which the decay of the intensity of the radiation radiated by the device under test measured at the antenna with increasing distance is proportional to the square or less to the square of the distance is decided to be the far-field.

2. The system according to claim 1,
    wherein the distance between the antenna and the device under test is adjustable, or wherein the distance between the antenna and the device under test is automatically adjusted according to the calculated minimum far-field distance.

3. The system according to claim 1,
    wherein calculating the minimum far-field distance is based on Friis transmission equation.

4. The system according to claim 1,
    wherein the difference between the different distances is constant making the distances equidistant.

5. The system according to claim 1,
    wherein the device under test is configured to measure signal power and to report the corresponding measured power values to the test unit.

6. The system according to claim 5,
wherein the report of the corresponding measured power values is transmitted to the test unit wirelessly.

7. The system according to claim 5,
wherein the report of the corresponding measured power values is transmitted to the test unit via a separate interface established for the purpose of transmitting the report.

8. The system according to claim 5,
wherein the report of the corresponding measured power values is transmitted to the test unit via an existing interface between the system and the device under test.

9. A method for testing a device under test with respect to a far-field region of the device under test, the method comprising the steps of:
determining several samples of measured power values at different distances between an antenna and the device under test with the aid of a test unit connected to the antenna, and
calculating a minimum far-field distance on the basis of the several samples of measured power values,
wherein the method further comprises the step of deciding the region in which the decay of the intensity of the radiation radiated by the device under test measured at the antenna with increasing distance is stronger as proportional to the square of the distance to be the near-field, and deciding the region in which the decay of the intensity of the radiation radiated by the device under test measured at the antenna with increasing distance is proportional to the square or less to the square of the distance to be the far-field.

10. The method according to claim 9,
wherein the method further comprises the step of adjusting the distance between the antenna and the device under test, or wherein the method further comprises the step of automatically adjusting the distance between the antenna and the device under test according to the calculated minimum far-field distance.

11. The method according to claim 9,
wherein the step of calculating the minimum far-field distance is based on Friis transmission equation.

12. The method according to claim 9,
wherein the difference between the different distances is constant making the distances equidistant.

13. The method according to claim 9,
wherein the method further comprises the step of measuring signal power and reporting the measured power values to the test unit with the aid of the device under test.

14. The method according to claim 13,
wherein the report of the corresponding measured power values is transmitted to the test unit wirelessly.

15. The method according to claim 13,
wherein the report of the corresponding measured power values is transmitted to the test unit via a separate interface to be established for the purpose of transmitting the report.

16. The method according to claim 13,
wherein the report of the corresponding measured power values is transmitted to the test unit via an existing interface between the system and the device under test.

* * * * *